United States Patent
Beer et al.

(10) Patent No.: US 6,639,856 B2
(45) Date of Patent: Oct. 28, 2003

(54) MEMORY CHIP HAVING A TEST MODE AND METHOD FOR CHECKING MEMORY CELLS OF A REPAIRED MEMORY CHIP

(75) Inventors: Peter Beer, Tutzing (DE); Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/158,031

(22) Filed: May 30, 2002

(65) Prior Publication Data

US 2002/0191454 A1 Dec. 19, 2002

(30) Foreign Application Priority Data

May 30, 2001 (DE) .......................................... 101 26 301

(51) Int. Cl.[7] .................................................. G11C 7/00
(52) U.S. Cl. .................... 365/200; 365/201; 365/189.07
(58) Field of Search ................................. 365/200, 201, 365/189.07, 189.05, 225.7, 230.07, 230.08

(56) References Cited

U.S. PATENT DOCUMENTS 5,579,265 A  11/1996  Devin
5,781,486 A * 7/1998  Merritt ........................ 365/201
5,894,441 A  4/1999  Nakazawa

FOREIGN PATENT DOCUMENTS

EP          0 669 576 B1     8/1995

* cited by examiner

*Primary Examiner*—David Lam
(74) *Attorney, Agent, or Firm*—Laurence A. Greenberg; Werner H. Stemer; Ralph E. Locher

(57) ABSTRACT

The memory chip has regular memory cells and standby memory cells for replacing faulty memory cells. There is provided a method for checking memory cells of a repaired memory chip, where the memory cells are checked by putting the memory chip into the state before repair. This actuates the memory cells identified as being faulty in spite of the provision of standby memory cells. This allows the operability of the memory chip to be checked after the repair procedure has been carried out. It is thus possible to identify, by way of example, whether a fault has been produced by the repair procedure.

7 Claims, 2 Drawing Sheets

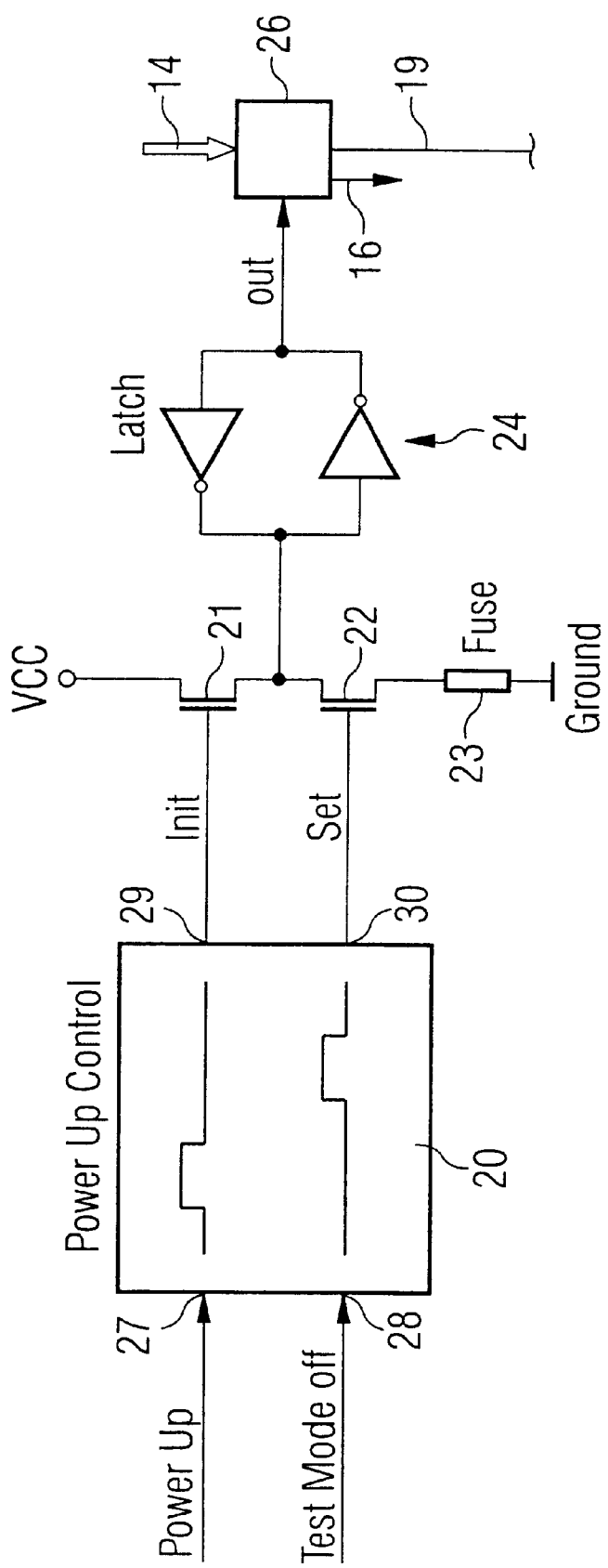

MEMORY CHIP HAVING A TEST MODE AND METHOD FOR CHECKING MEMORY CELLS OF A REPAIRED MEMORY CHIP

BACKGROUND OF THE INVENTION

Field of the Invention

The invention lies in the memory technology field. More specifically, the invention relates to a memory chip having memory cells and an address circuit which is connected to address lines for the purpose of supplying an address. The address circuit is connected to the memory cells via selection lines for the purpose of activating the memory cells. Following presentation of an address on the address lines, the address circuit activates a prescribed memory cell via the selection lines, so that a data item can be read from the memory cell or can be written to the memory cell. The address circuit is connected to standby memory cells via further selection lines. A first address memory is provided which can store addresses for faulty memory cells. The address circuit compares a prescribed address with the addresses in the first address memory and, if the prescribed address is held in the first address memory, activates a standby memory cell instead of the faulty memory cell.

The invention further pertains to a method for checking memory cells of a repaired memory chip. In the generic method, a memory cell is stipulated by the presentation of an address, and the memory cell associated with the address is activated for the purpose of writing or reading a data item. A repair procedure for a memory cell identified as being faulty stipulates a standby memory cell which, upon presentation of the address of the faulty memory cell, is activated instead of the faulty memory cell.

Memory chips have a multiplicity of memory cells which are produced using a multiplicity of complex procedural steps. For the memory cells to operate correctly, great demands need to be placed on the quality of the procedural steps. The great demands and the multiplicity of memory cells mean that it is scarcely possible for all the memory cells to be operable following production of the memory chip. However, since it is not economical to reject the entire memory chip on account of single faulty memory cells, a test procedure is performed following production of the memory chip, wherein the operability of the memory cells is checked. If faulty memory cells are identified, the memory chip contains standby memory cells, and a faulty memory cell is replaced by a standby memory cell. To this end, the address of the faulty memory cell is assigned the standby memory cell in an address circuit. Redirection from the faulty memory cell to the standby memory cell allows the memory chip to be used following repair without adversely affecting the performance of the memory chip. A corresponding memory chip is described in U.S. Pat. No. 5,894,441.

Despite the described method for repairing faulty memory cells, faulty memory cells can be present again after the repair has been carried out.

SUMMARY OF THE INVENTION

It is accordingly an object of the invention to provide a memory chip and a method for checking memory cells of a memory chip, which overcomes the above-mentioned disadvantages of the heretofore-known devices and methods of this general type and which allows an improved account to be given of the operability of the memory cells of the memory chip.

With the foregoing and other objects in view there is provided, in accordance with the invention, a memory chip, comprising:

a plurality of memory cells;

an address circuit connected to address lines for supplying an address and to the memory cells via selection lines for activating respective the memory cells;

the address circuit, upon receiving an address on the address lines, activating a prescribed memory cell via the selection lines, to enable a data item to be read from or to be written to the memory cell;

standby memory cells connected to the address circuit via further selection lines;

a first address memory connected to the address circuit for storing addresses for faulty memory cells;

the address circuit comparing a prescribed address with the addresses in the first address memory and, if the prescribed address is held in the first address memory, activating a respective the standby memory cell instead of the faulty memory cell;

a test circuit connected to the address circuit, and outputting a signal to the address circuit in a test mode; and if the signal is present and an address for a faulty memory cell is applied, the address circuit activating the faulty memory cell instead of the respective the standby memory cell.

One advantage of novel memory chip is that, following the performance of a repair wherein faulty memory cells have been replaced by standby memory cells, the memory chip can be switched back to the original state, i.e. to the state before the repair. This makes it possible to carry out a further check on the operability of the memory cells following the repair, but using the faulty memory cells. It is thus possible, by way of example, to spot whether a faulty memory cell has been overlooked, or whether the repair itself has produced a fault in the memory chip and hence the operability of a memory cell has been impaired. A time saving and an increase in quality can thus be achieved, particularly when verifying new circuit designs. On the basis of the test result, it is also possible to check test functions which are used for checking the memory cells. This also permits a time saving and an increase in quality when developing and checking test functions.

In accordance with an added feature of the invention, there are provided an address circuit and a standby address circuit. The standby address circuit is connected to a test circuit. The standby address circuit receives the test signal from the test circuit, and the standby address circuit prevents a faulty memory cell from being addressed by a standby memory cell when the test signal is present. This returns the memory chip to the unrepaired state.

Preferably, storage of the address of the faulty memory cell is designed to be in the form of fuses. The use of fuse technology affords a simple and fully matured technology for storing the addresses.

In accordance with a preferred refinement of the invention, the test circuit is formed using two series-connected transistors and a latch memory connected between the transistors. The two transistors are switched by a control generator, with the latch memory being set to a default value or to a voltage value stipulated by a fuse, depending on the switching state of the two transistors. This permits a simple design for the test circuit.

With the above and other objects in view there is also provided, in accordance with the invention, a method of checking memory cells of a repaired memory chip, where a memory cell is stipulated by the presentation of an address, and the memory cell associated with the address is activated for writing or reading a data item, where a repair procedure for a memory cell identified as being faulty stipulates a standby memory cell which, upon presentation of the address of the faulty memory cell, is activated instead of the faulty memory cell. The method is characterized by a step of activating the faulty memory cell instead of the standby memory cell when a test signal has been presented.

An advantage of the inventive method as outlined above is that even in a repaired memory chip, for which a standby memory cell is activated at an address for a faulty memory cell, the memory cell identified as being faulty is activated again for a checking procedure instead of the standby memory cell. This allows the memory cell identified as being faulty to be tested. It is thus possible to improve test procedures and, by way of example, to compare the test response of the memory chip before repair with the test response of the memory chip after repair. Faults caused by the repair operation are thus identified, for example.

In accordance with a concomitant feature of the invention, the repair of a memory cell identified as being faulty by a redundant memory cell is reversed if the test procedure shows that the memory cell identified as being faulty is actually operating correctly.

Other features which are considered as characteristic for the invention are set forth in the appended claims.

Although the invention is illustrated and described herein as embodied in a memory chip having a test mode and method for checking memory cells of a repaired memory chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic diagram of a test circuit for a memory chip.

DESCRIPTION OF THE PREFERRED EMBODIMENTS

Figure 1:
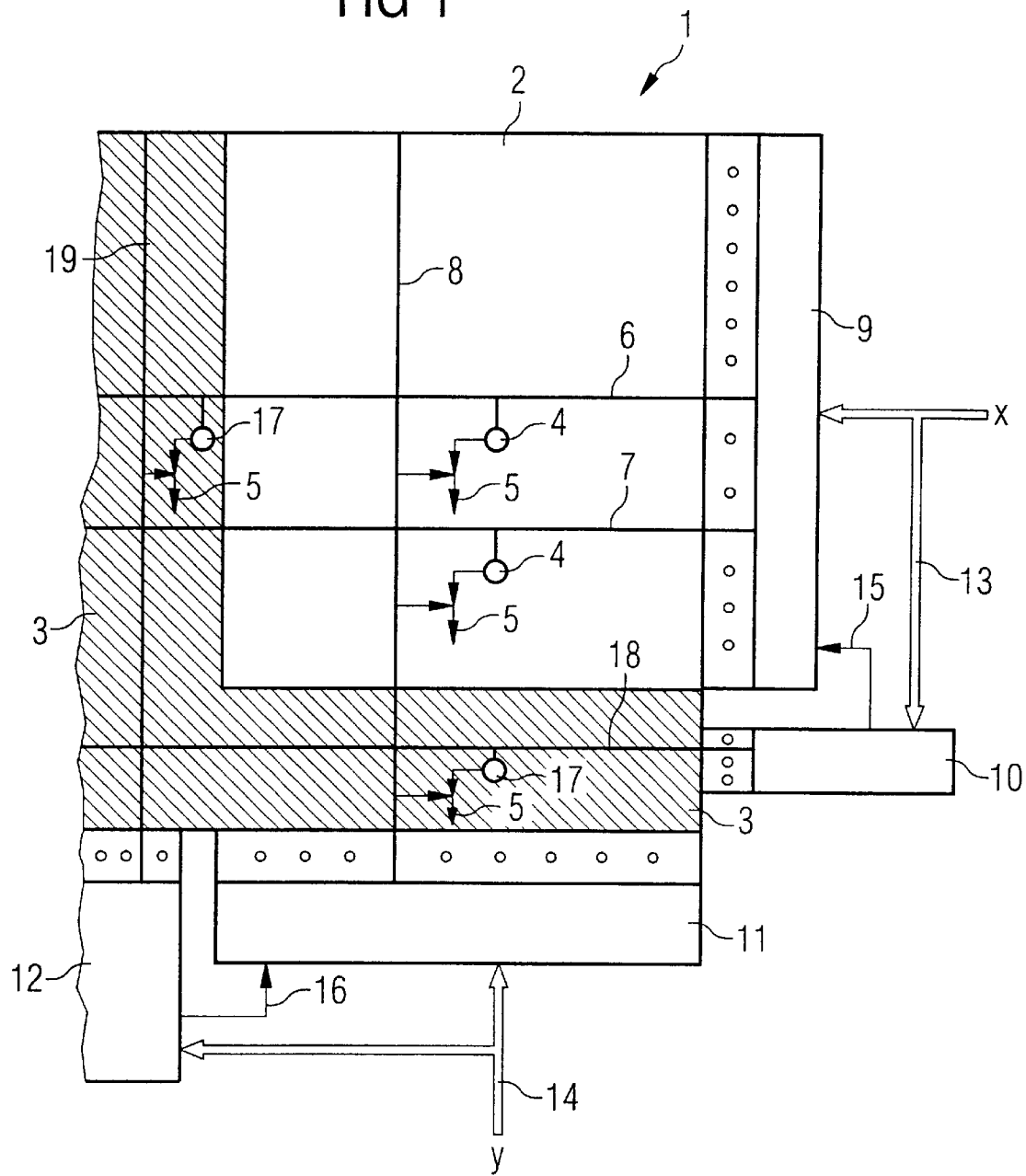
FIG. 1 is a schematic and diagrammatic illustration of a memory chip.

Referring now to the figures of the drawing in detail and first, particularly, to FIG. 1 thereof, there is shown a memory chip 1 having a cell array 2 which has a multiplicity of memory cells 4. In addition, a standby cell array 3 is provided which has a multiplicity of standby memory cells 17. The memory cells 4 and standby memory cells 17 are respectively connected to an amplifier circuit 5. The memory cells 4 and the standby memory cells 17 are arranged in a matrix form and can be actuated by activating a row line 6, 7 and a column line 8. FIG. 1 shows only two row lines 6, 7, a standby row line 18, a column line 8 and a standby column line 19, but the memory chip 1 has a multiplicity of column lines, row lines, standby column lines, and standby row lines.

The row lines 6, 7 are connected to a row decoder 9, and the standby row line 18 is connected to a standby row decoder 10. In addition, the first column line 8 is connected to a column decoder 11, and the standby column line 19 is connected to a standby column decoder 12.

If a memory cell needs to be activated, i.e. a data item needs to be written to the memory cell or a data item needs to be read from the memory cell, an address containing an X address part and a Y address part is routed to the memory chip 1. The X address part is routed to the row decoder 9 and to the standby row decoder 10 via X address lines 13. The Y address part is routed to the column decoder 11 and to the standby column decoder 12 via Y address lines 14. On the basis of the X address part, the row decoder 9 ascertains one of the row lines 6, 7 and activates the row line 6, 7, i.e. a voltage signal is output onto the row line 6, 7. In parallel therewith, the column decoder 11 ascertains one of the column lines 8 associated with the Y address part on the basis of the Y address part supplied. A prescribed voltage signal is then output onto the selected column line 8. If, by way of example, the first row line 6 and the first column line 8 are selected using the supplied X and Y address parts, then firstly the first memory cell 4 connected to the first row line 6 is activated. Activation involves the charge stored in the memory cell 4 being transferred to the associated amplifier circuit 5. At the same time, the first column line 8 is used for conductively connecting the amplifier circuit 5 for the memory cell 4 to an output circuit. The output line can thus be used to read the data item stored in the first memory cell 4 or to write a data item to the first memory cell 4 in a read-in operation using the output circuit.

If, following production of the memory chip 4, the performance of appropriate test procedures reveals that memory cells 4 in the cell array 2 are faulty, then the address of the faulty memory cells is stored in the standby row decoder 10 and in the standby column decoder 12. At the same time, the address of the faulty memory cell is assigned a standby address for a correctly operating standby memory cell 17. The standby memory cells 17 are also checked for correct operation, and only the standby memory cells 17 operating correctly are used to repair the memory cells 2.

If, by way of example, the X address part for a faulty memory cell 4 is now supplied to the row decoder 9 and to the standby row decoder 10, then the standby row decoder 10 recognizes, by means of a comparison with the supplied address, that an address for a faulty memory cell 4 is involved. A blocking signal is then automatically output to the row decoder 9 via a first blocking line 15. When the blocking signal has been received, the row decoder 9 does not actuate the row line 6, 7 associated with the address. At the same time, the standby row decoder 10 actuates the standby row line 18 associated with the faulty address. Addresses for faulty memory cells are thus automatically redirected to standby memory cells 17.

Redirection is effected in a corresponding manner when a Y address part is supplied to the column decoder 11 and to the standby column decoder 12. If the standby column decoder 12 recognizes that the Y address part supplied matches an address part which has been stored for a faulty memory cell, the standby column decoder 12 sends a blocking signal to the column decoder 11 via the second blocking line 16. The column decoder 11 then does not actuate the column line associated with the supplied address. However, the standby column decoder 12 actuates a standby column line 19 stipulated as a substitute for the faulty address.

This makes it possible for faulty memory cells in the cell array 2 to be replaced by standby memory cells 17 in the standby cell array 3. This allows the faulty memory cells to be repaired.

FIG. 2 shows a detail of the standby column decoder 12 which shows fundamental elements of a test circuit. A control circuit 20 having a first and a second input 27, 28 is provided. A power-up signal from a control circuit (not shown) is supplied at the first input. A start signal for a test mode is supplied at the second input 28.

The control circuit 20 has a first and a second output 29, 30. The first output 29 is connected to a control connection on a first transistor 21, and the second output 30 is connected to a control connection on a second transistor 22. The first and second transistors 21, 22 are connected in series, with a first connection on the first transistor 21 being connected to a voltage supply. A second connection on the first transistor 21 is connected to a first connection on the second transistor 22 and is also connected to a register 24. A second connection on the second transistor 22 is connected to a fuse 23, a second connection of which is connected to a reference potential, preferably a ground potential. An output of the register 24 is connected to an actuating circuit 26. The actuating circuit 26 is connected to the standby column lines 19 of the standby cell array 3. The register 24 stores, as a default value, a value which does not correspond to any address. The address of the faulty memory cell has been determined in a preceding test procedure and has been programmed into the fuses 23. FIG. 2 shows only one fuse 23, but the arrangement contains as many fuses as are required for representing the address.

For each standby memory cell 17, a fuse 23 connected to the actuating circuit 26 is provided. When the memory chip 1 is started up, the control circuit (not shown) first outputs a start signal to the control circuit 20, which then outputs an Init pulse via the first output 29 and then a Set pulse via the second output 30. The Init pulse sets the register 24 to a default value which corresponds to the value of the faulty memory cell. The Set pulse ensures that the value of the fuses 23 is read and the latch is set to the value programmed using the fuse. If, following this starting sequence, the register 24 is no longer at its default value, then this means that a standby memory cell needs to be replaced by the faulty memory cell normally replaced by the standby memory cell.

The use of a test mode means that it is possible that the fuses 23 are not activated. The associated registers 24 thus remain at their default value. The register 24 forwards the stored address to the actuating circuit 26. The actuating circuit 26 is connected to the Y address lines 14. The actuating circuit 26 compares the address supplied by the register 24 with the address supplied by the Y address lines 14. If the addresses match, the actuating circuit does not perform a function. However, if the addresses are different, the actuating circuit sends a blocking signal to the column decoder 11 via the second blocking line 16. When the blocking signal has been received, the column decoder 11 does not perform a function. The standby column decoder 12 controls the standby column line 19, which is associated with the address output by the register 24. This means that, in the case where the test signal is output to the control circuit 20, the function of the standby column decoder is suppressed and the faulty column line is actuated instead of the standby column line 19 provided during the repair. The standby row decoder 10 is also designed in a corresponding manner and also works in a similar way.

This provides a simple way of putting the memory chip 1 into the unrepaired state.

Following the repair operation and following transfer to the unrepaired state, the memory chip 1 is preferably subjected to further test procedures, wherein the operability of the memory cells 4 and of the standby memory cells 17 is again checked.

Faults are normally repaired using entire word lines or bit lines. If only a single memory cell fails, it can be repaired either using a redundant word line or using a redundant bit line. A redundancy algorithm ascertains the optimum repair.

Each redundant memory cell has a permanently associated set of fuses+circuit (FIG. 2). The precise number is: number of addresses+1 master fuse. If the chip has eight Y addresses and ten X addresses, for example, then each redundant bit line has nine fuses and each redundant word line has eleven fuses. If the master fuse is blown, this means that this redundant element is being used. The rest of the fuses are assigned the address which is to be repaired. If the master fuse has been blown, each address (each Y address in the case of a redundant bit line, and each X address in the case of a redundant word line) is compared with the burnt-in address. From the comparison, the standby row decoder or the standby column decoder identifies a redundant memory cell which is to be actuated.

We claim:

1. A memory chip, comprising:
   a plurality of memory cells;
   an address circuit connected to address lines for supplying an address to said memory cells via selection lines for activating respective said memory cells;
   said address circuit, upon receiving an address on the address lines, activating a prescribed memory cell via said selection lines, to enable a data item to be read from or to be written to said memory cell;
   standby memory cells connected to said address circuit via further selection lines;
   a first address memory connected to said address circuit for storing addresses for faulty memory cells;
   said address circuit comparing a prescribed address with the addresses in said first address memory and, if the prescribed address is held in said first address memory, activating a respective said standby memory cell instead of said faulty memory cell;
   a test circuit connected to said address circuit, and outputting a signal to the address circuit in a test mode; and
   if the signal is present and an address for a faulty memory cell is applied, said address circuit activating said faulty memory cell instead of the respective said standby memory cell.

2. The memory chip according to claim 1, wherein:
   said address circuit has a standby address circuit;
   said standby address circuit is connected to said test circuit;
   said standby address circuit is connected to said standby memory cells via further selection lines;
   when an address is applied, said standby address circuit checks whether the address matches the address of a faulty memory cell;
   if the addresses match, said standby address circuit switches said address circuit to a waiting mode, and activates a standby memory cell instead of the addressed memory cell; and
   when the signal is present, said standby address circuit performs no function.

3. The memory chip according to claim 1, wherein the address of a faulty memory cell is stored in the form of fuses.

4. The memory chip according to claim 1, wherein
   said test circuit comprises a control circuit and first and second series-connected transistors each having a control connection, a first connection, and a second connection;

said control circuit having first and second outputs connected to said control connections of said first and second transistors;

said first connection of said first transistor is connected to a first reference potential, and said second connection of said first transistor is connected to said first connection of said second transistor;

said second connection of said second transistor is connected to a second reference potential via a fuse, and the fuse represents the address of a faulty memory cell;

said address circuit performs no function when the blocking signal is received;

said control circuit turns on only the first transistor and not the second transistor in the test mode; and said register consequently does not store an address for a memory cell.

5. In a method of checking memory cells of a repaired memory chip, where a memory cell is stipulated by the presentation of an address, and the memory cell associated with the address is activated for writing or reading a data item, where a repair procedure for a memory cell identified as being faulty stipulates a standby memory cell which, upon presentation of the address of the faulty memory cell, is activated instead of the faulty memory cell, the improvement which comprises:

activating the faulty memory cell instead of the standby memory cell when a test signal has been presented.

6. The method according to claim 5, which comprises subjecting the faulty memory cell to a test procedure, and evaluating a test result.

7. The method according to claim 6, which comprises reversing a substitution of the redundant memory cell for the faulty memory cell if the test procedure shows that the faulty memory cell is actually operating correctly.

* * * * *